United States Patent [19]
Tripier et al.

[11] Patent Number: 5,247,258
[45] Date of Patent: Sep. 21, 1993

[54] SYSTEM FOR MEASURING PARTIAL DISCHARGES

[75] Inventors: Jean-Louis Tripier, Vincennes; Jean-Yves Bergot, Pierrefitte, both of France

[73] Assignee: GEC Alsthoma SA, Paris, France

[21] Appl. No.: 646,626

[22] PCT Filed: Aug. 3, 1989

[86] PCT No.: PCT/FR89/00406
§ 371 Date: Feb. 1, 1991
§ 102(e) Date: Feb. 1, 1991

[87] PCT Pub. No.: WO90/01704
PCT Pub. Date: Feb. 22, 1990

[30] Foreign Application Priority Data
Aug. 4, 1988 [FR] France ............... 88 10565

[51] Int. Cl.⁵ ........................... G01R 31/00
[52] U.S. Cl. ........................... 324/536; 324/532; 324/551; 324/541; 324/544; 340/650; 340/659; 361/111
[58] Field of Search ............ 324/551, 536, 552, 540, 324/541, 544, 532; 364/551.01; 361/111

[56] References Cited

U.S. PATENT DOCUMENTS

| | | | |
|---|---|---|---|
| 3,984,768 | 10/1976 | Staples | 324/551 |
| 4,140,965 | 2/1979 | Neal | 324/551 |
| 4,362,986 | 12/1982 | Burke et al. | 324/552 |
| 4,757,263 | 7/1988 | Cummings, III et al. | 364/551.01 |
| 4,882,682 | 11/1989 | Takasuka et al. | 364/551.01 |
| 4,896,115 | 1/1990 | LeMaitre | 324/551 |

FOREIGN PATENT DOCUMENTS

| | | | |
|---|---|---|---|
| 0110413 | 6/1984 | European Pat. Off. | 364/551.01 |
| 0717669 | 2/1980 | U.S.S.R. | 324/551 |
| 1287053 | 1/1987 | U.S.S.R. | 324/540 |
| 1307399 | 4/1987 | U.S.S.R. | 324/551 |

*Primary Examiner*—Kenneth A. Wieder
*Assistant Examiner*—Jose M. Solis
*Attorney, Agent, or Firm*—Sughrue, Mion, Zinn, Macpeak & Seas

[57] ABSTRACT

A system for measuring partial discharges comprises a plurality of acquisition circuits each including a signal shaping circuit delivering a signal value, a multiplexer enabling the signal values provided by the various acquisition circuits to be delivered in succession on a common path, an acquisition trigger circuit responding to the existence of an acquisition command signal provided when the input level of at least one of the acquisition circuits exceeds a defined threshold and defining an acquisition command signal, and a signal treatment and storage system responding to the acquisition command signal and then performing an acquisition cycle during which it stores the values of the signals provided by the various acquisition circuits via the multiplexer.

6 Claims, 4 Drawing Sheets

SYSTEM FOR MEASURING PARTIAL DISCHARGES

The present invention relates to a system for measuring partial discharges.

BACKGROUND OF THE INVENTION

For example, partial discharges occur in equipment used in the high tension installations of networks for transporting and distributing electrical power. In a sequence of dielectrics subjected to high tension, one item is the seat of a breakdown, and the energy corresponding to the capacitive charge of said item is dissipated in the form of high frequency oscillation. The other items in the sequence retain their integrity, so the partial discharge does not lead to overall breakdown.

A study of partial discharges can be used to evaluate the quality of a piece of equipment and to provide useful information when quality is to be improved. It is therefore important to be able to perform measurements relating to partial discharges. Special measuring apparatuses have been developed for this purpose. By way of example, mention may be made of measurement system 9100 provided by the firm "Tettex AG" and described in the publication "Tettex Instruments-Information", No. 21, April 1987. Such apparatus performs measurement on current and voltage pulses produced by partial discharges and it displays the maximum values observed. Individual pulses may also be observed by means of an oscilloscope. In addition, the repetition of partial discharges is also significant. In communication No. 15-12, entitled (in translation) "Search for correlation between the energy of partial discharges and the degradation of paper/oil insulation", by F. Viale et al., given to the 1982 session of the International Conference on Large Electricity Networks, mention is made of integrating the energy of partial discharges over a given period.

The article "Simultane Erfassung und Verarbeitung von Teilentladungs-Kenngrossen zur Beurteilung elektrischer Isolierungen" by F. H. Kreuger et al., describes a system in which a microcomputer receives various digital values relating to each instant of a single partial discharge. The article deals with measures to be taken for reducing the volume of information to be stored and it even mentions conserving the time conditions of the recorded signals, but without proposing any solution.

Patent document DE-36 12 234 describes a system of the same type.

U.S. Pat. No. 4,757,263 describes apparatus for monitoring various electrical magnitudes in a single installation, however these magnitudes are basically continuous in nature, unlike the signals generated by partial discharges which are pulse signals and unpredictable.

Observing partial discharges at a plurality of points gives rise to the problem of recording a huge quantity of information continuously or quasi-continuously, unless observation periods are selected arbitrarily, in which case there is a danger of missing useful observations, or unless the results of the observations are treated which is expensive in treatment means. None of these solutions is satisfactory. In practice this prevents an experimenter from having a complete picture of discharge activities, and leaves it to the experimenter's experience or skill in selecting discharges that are particularly significant. However, there are numerous cases when it would be desirable to obtain fuller information on partial discharges, particularly during studies bearing on the correlation between the discharges and the deterioration of the equipment in which they take place. Although the energy of a partial discharge is indeed a measure of its harmfulness, it is also necessary to know what type of discharge is involved, i.e. where it has taken place. This may be deduced from observations made simultaneously at several points, for example.

A particular object of the present invention is to provide a system for measuring partial discharges and satisfying this requirement.

SUMMARY OF THE INVENTION

The present invention provides a measurement system for measuring partial discharges comprises a plurality of acquisition circuits, each including a signal input and a signal shaping circuit for providing a signal value, a multiplexer serving to deliver signal values provided by the various acquisition circuits, said signal values being delivered in succession on a common path leading to a signal treatment and storage system, wherein some of the acquisition circuits are partial discharge acquisition circuits and receive different partial discharge signals coming from different points of an installation, and wherein an acquisition triggering circuit is provided which responds to the existence of a partial discharge signal as provided by a comparator whenever the input level to at least one of said partial discharge acquisition circuits exceeds a defined threshold by delivering an acquisition command signal, said signal treatment and storage system responding to an acquisition command signal by performing an acquisition cycle during which it stores the values of the signals provided by the various acquisition circuits via the multiplexer.

Such a system makes it possible to record groups of signal values asynchronously, each signal value corresponding to one of successive partial discharges. However, it is important to locate the partial discharges in time.

One of said acquisition circuits is a voltage acquisition circuit and it provides an instantaneous measurement of the alternating voltage of the distribution network.

This makes it possible to locate a group of signal values relative to the half-period of the alternating voltage.

The voltage acquisition circuit may include means making its supply of a measurement of the alternating voltage of the distribution network conditional on the presence of said acquisition command signal.

Said acquisition trigger circuit may include means that respond to the appearance of a maximum voltage value on the input of said voltage acquisition circuit by providing an additional acquisition command signal, the said signal processing and storage system responding to the additional acquisition command signal by performing an acquisition cycle.

This has the consequence of making it possible to locate groups of recorded values relative to the half-periods of the network voltage.

In one embodiment, said signal treatment and storage system is a suitably programmed commercial computer. The signal values are converted into digital form, preferably after being multiplexed.

BRIEF DESCRIPTION OF THE DRAWINGS

An embodiment of the invention is described by way of example with reference to the accompanying drawings, in which.

DETAILED DESCRIPTION OF THE PREFERRED EMBODIMENTS

Figure 1:
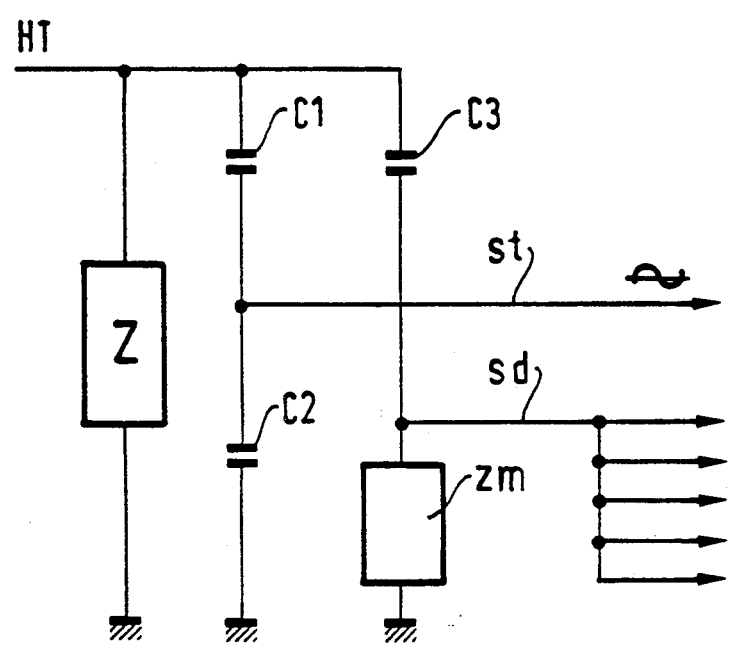
FIG. 1 is a theoretical diagram of circuits for obtaining signals to be measured by the system of the invention.

Reference is made initially to FIG. 1 which shows test equipment Z connected between ground and a high tension power line HT together with both a capacitive voltage divider constituted by capacitors C1 and C2 for obtaining voltage measurement signals, with output st taken from the common point between the capacitors making a voltage signal available in the form of an alternating voltage whose value is a fraction of the high tension, and also, in conventional manner, a capacitor C3 and an impedance zm constituting a voltage divider for obtaining partial discharge measurement signals, with the output sd taken from the common point between them delivering a partial discharge pulse signal each time a partial discharge occurs in the equipment Z, which impulse signal has the general form of a damped sinewave oscillation.

Figure 2:
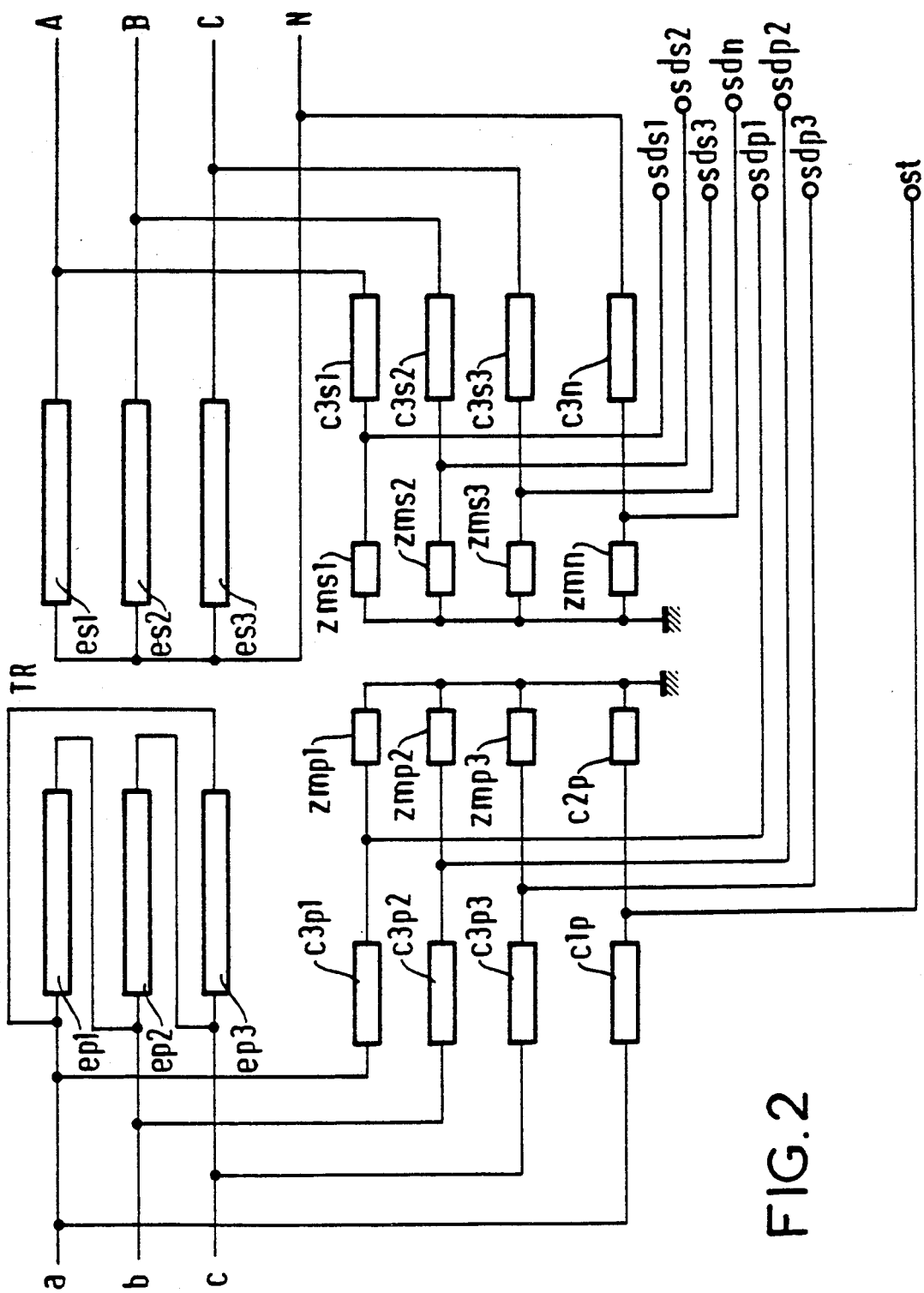
FIG. 2 is a connection diagram of the system of the invention when the measurements relate to a transformer.

As an example of equipment under test, FIG. 2 shows a three-phase transformer TR having three primary windings ep1, ep2, ep3 in a delta configuration connected to the three wires a, b, and c of a low tension line, and having three secondary windings es1, es2, es3 in a star configuration connected to the four wires A, B, C, and N of a distribution line.

In accordance with the circuit shown in FIG. 1, capacitors c3p1, c3p2, c3p3, c3s1, c3s2, c3s3 and c3n are provided to perform the measurement function of capacitor C3, and impedances zmp1, . . . , zms3, and zmn are provided to perform the function of the impedance zm, relative to partial discharge output signals sdp1 to sds3 and sdn. Similarly, capacitors c1p and c2p perform the function of capacitors C1 and C2 relative to a voltage signal output.

Figure 3:
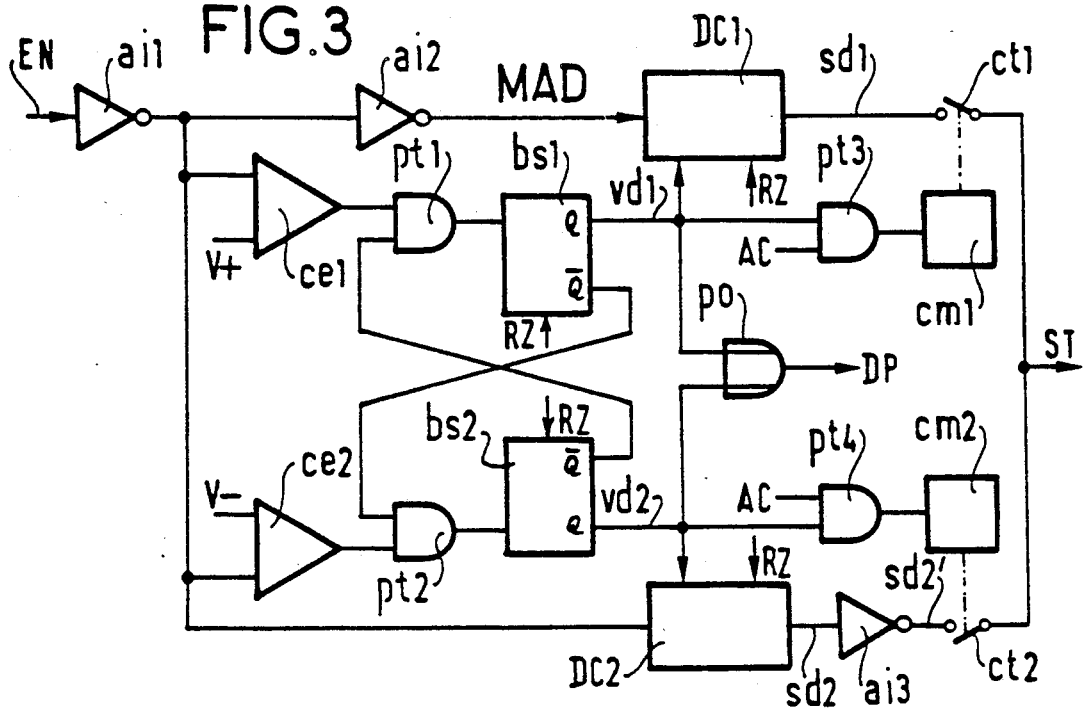
FIG. 3 is a block diagram of a circuit for acquiring partial discharges.

The partial discharge acquisition circuit MAD of FIG. 3 treats any one of the partial discharge signals and shapes it. In addition, it contributes to generating an acquisition command signal. This circuit has an input EN connected for example to output sds1 of FIG. 2 and it includes a first inverting amplifier ai1 for matching levels. The resulting signal at the output from amplifier ai1 is applied to one of the inputs of each of two comparators ce1 and ce2 which also receive two reference voltages $V+$ and $V-$. If the output signal from the amplifier ai1 exceeds the voltage $V+$, then the comparator ce1 provides a signal which passes through gate pt1 and changes the position of bistable bs1. This then provides a signal vd1 which activates a peak detector DC1. Simultaneously, a complementary signal vr1 blocks the gate pt2. Thereafter, the peak detector DC1 which receives the output signal from amplifier ai1 via an additional unit-gain inverting amplifier ai2 maintains a signal level on its output sd1 corresponding to the maximum positive level reached by the input signal. Simultaneously, the output provides a signal DP via an OR gate po indicating that a partial discharge has been detected. The level reached by the partial discharge is read by delivering a signal AC. Together with the signal vd1, the signal AC unblocks the gate pt3 and causes a switch cm1 to operate, closing a contact ct1, such that the level of the signal present on the output sd1 of the peak detector DC1 is delivered to the output ST of the circuit.

If the input signal is negative and exceeds the threshold $V-$, then operation via the comparator ce2, gate pt2, bistable bs2, gate pt4, and switch cm2 closing contact ct2 is the same, and peak detector DC2 receives the output signal from the amplifier ai1 directly and consequently treats a signal having the same polarity as the peak detector DC1, while the unity gain auxiliary amplifier ai3 inverts the output signal sd2 from the peak detector DC2 to provide a signal sd2' on the output ST and having the same polarity as the input signal. The signal DP is provided by the gate po as before.

In this way, the circuit MAD of FIG. 3 selects the polarity of the first half cycle of a partial discharge signal when one appears, and it retains the value of the peak voltage reached for this polarity, which value is prepared as the value of the signal, and in addition a signal indicative of the presence of a partial discharge is provided to request acquisition. Acquisition serves to read the value of the signal on output ST. Thereafter a signal RZ resets the bistable bs1 or bs2 and the peak detector DC1 or DC2 to zero and the circuit returns to its initial state.

Figure 4:
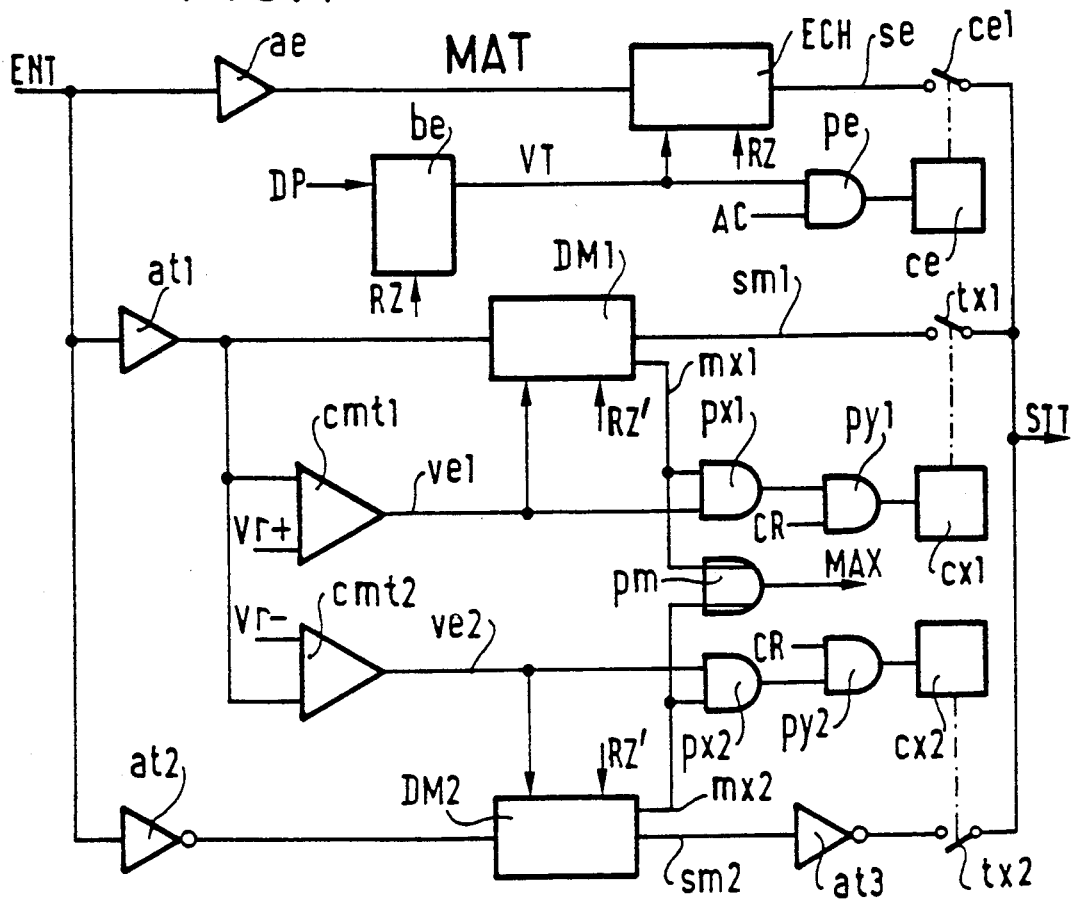
FIG. 4 is a block diagram of a circuit for acquiring the alternating power supply voltage.

The power supply alternating voltage acquisition circuit MAT of FIG. 4 shapes the voltage signals coming, for example, from the output st of the circuit of FIG. 2 and triggers acquisition whenever the voltage exceeds a positive or negative maximum. In fact, these two aspects are treated separately.

The voltage signal is shaped mainly by means of a sampling circuit ECH which receives the signal delivered to the input ENT of the circuit via a unity gain impedance-lowering amplifier ae. The signal DP delivered by any of the circuits as shown in FIG. 3 when a partial discharge occurs changes the position of a bistable be which enables the sampling circuit ECH. This records the value of the voltage being delivered to it at this instant by the amplifier ae and maintains the recorded value on its output se. At the acquisition instant, the output signal from bistable be enables the signal AC to pass through the gate pe and operate the switch ce which then closes its contacts ce1, thus delivering the value of the sampled voltage on output STT.

Thus, this portion VT of the circuit shown in FIG. 4 operates as a complement to the circuits MAD such as that shown in FIG. 3, and on the occasion of each partial discharge it provides a value of the alternating voltage read from one of the high tension line conductors feeding the equipment under test; this makes it possible to locate the partial discharge within a half period of the alternating voltage.

The invention also provides for detecting and recording the positive and negative maxima of the alternating voltage in order to enable partial discharges to be located in time relative to half-periods of the alternating voltage.

To this end, the input voltage to the circuit MAT of FIG. 4 is applied via a unity gain impedance reducing amplifier at1 to a comparator cmt1 which also receives a voltage Vr+. This voltage is relatively low and serves to direct the positive and negative half cycles of the alternating voltage to circuits designed to treat them. When this voltage is exceeded, the comparator cmt1 provides a signal ve1 which enables the maximum detector circuit DM1. A circuit of this type is sold by "Precision Monolithics Inc.", under reference PKD-01. This circuit monitors the signal which is delivered thereto by the amplifier at1, and with appropriate time constants, and delivers a signal mx1 when the amplitude of this signal begins to drop. Via a gate pm, this signal mx1 provides a signal MAX indicative of a maximum (positive in this case) in the evaluated alternating voltage and requests an acquisition. In addition, the circuit DM1 samples the alternating signal and maintains on its output sm1 the sample which it obtained at the moment when it delivered the signal mx1. Via the gate px1, the signal mx1 enables the gate py1. During acquisition, a signal CR is delivered to the circuit of FIG. 4 and, via the gate py1, it actuates the switch cx1 which closes its contacts tx1. The positive maximum value of the alternating voltage is thus transferred to the output STT.

The input voltage reproduced at the output of the amplifier at1 is also applied to a comparator cmt2 for detecting when a threshold Vr— is passed and consequently delivering a signal ve2 enabling the circuit DM2 which is identical to the circuit DM1. This circuit DM2 receives the input voltage via a unity gain inverting amplifier at2. It thus operates in the same way as the circuit DM1. It thus provided a signal mx2 when the input voltage passes through a negative maximum, whereupon the gate pm provided the acquisition request signal MAX. The sampled value maintained on the output sm2 of the circuit DM2 is inverted by inverting amplifier at3. On acquisition, since the gate px2 is enabled by the signals ve2 and mx2, it enables the gate py2 which transmits the signal CR to the switch cx2 which closes the contacts tx2 and the negative maximum value of the input voltage to the circuit of FIG. 4 is transmitted to its output STT.

The circuit MAT of FIG. 4 thus causes a maximum voltage to be acquired during each half cycle of the power supply voltage. By counting these half-periods, it is possible to follow the passage of time until a partial discharge aquisition appears, thereby enabling this partial discharge to be located in a defined half-period. It is recalled that localization within the half-period will result from the voltage value delivered by the sampling circuit ECH in comparison with the values of adjacent maximum voltages.

Figure 5:
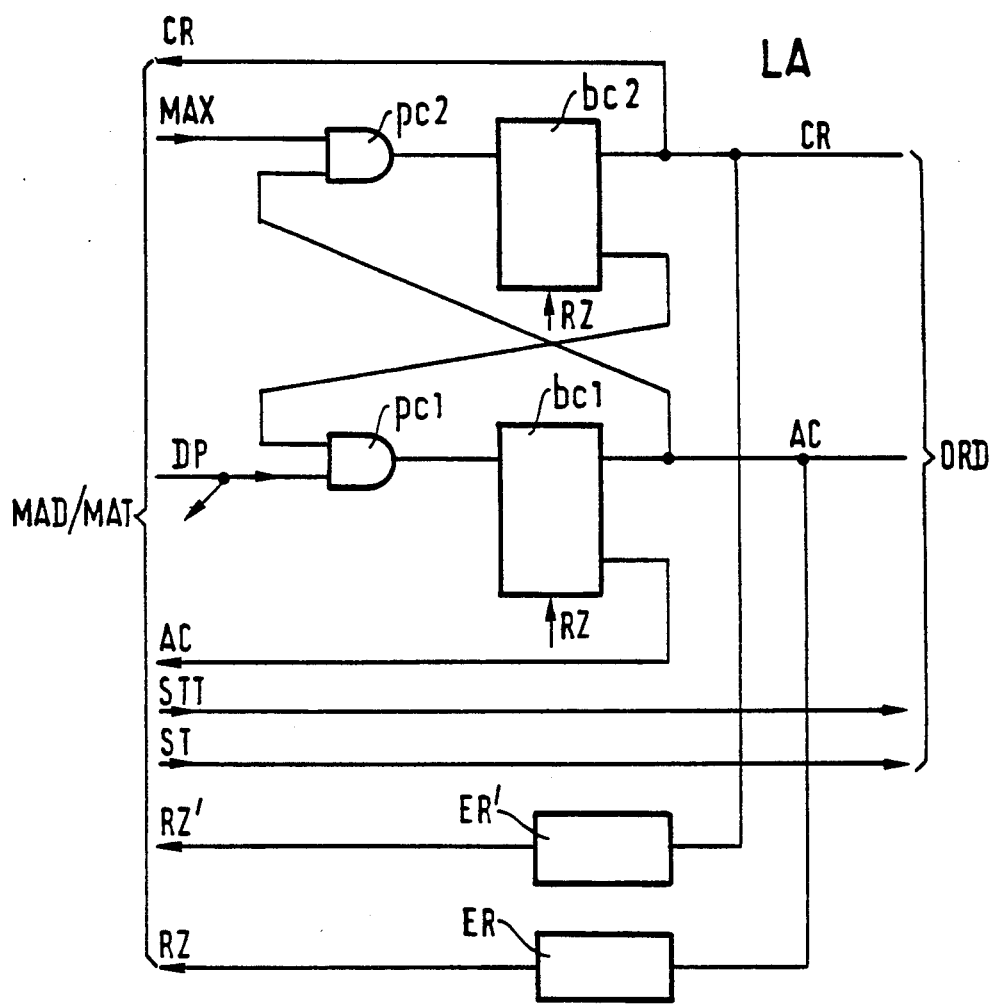
FIG. 5 is a diagram of an acquisition control circuit.

The acquisition control logic circuit LA of FIG. 5 serves as an interface between the circuits MAD and MAT of FIGS. 3 and 4 and a suitably programmed general purpose computer ORD. If the bistable bc2 is indeed at rest, a signal DP from a circuit such as that shown in FIG. 2 acts via a gate pc1 to change the position of a bistable bc1 which blocks a gate pc2. The bistable bc1 delivers the above-mentioned signal AC by means of which each circuit MAD such as that shown in FIG. 3 provides a partial discharge signal on its output ST corresponding to the peak amplitude of the first half-cycle of the pulse signal caused by the partial discharge, whereas the circuit MAT of FIG. 4 provides the value of the alternating voltage at said instant as maintained by the sampling circuit ECH.

The signal AC is also transmitted to the computer ORD in order to cause an acquisition cycle to be executed, whereby the values presented in this way are recorded. Thereafter, after an adequate delay provided by a delay stage ER, the circuit LA provides the signal RZ which resets the bistable bc1 and simultaneously resets the circuits MAD and MAT of FIGS. 3 and 4.

When the signal MAX is delivered by the circuit of FIG. 4, and if or as soon as the bistable bc1 is at rest, gate pc2 conducts and bistable bc2 changes position, thereby closing gate pc1 and providing the signal CR. An acquisition cycle similar to the preceding is accomplished. It terminates by delivering a signal RZ' via the delay circuit ER' of the module LA itself, thereby returning the bistable bc2 to its initial position and also the maxima detector DM1 or DM2 of the circuit of FIG. 4.

Figure 6:
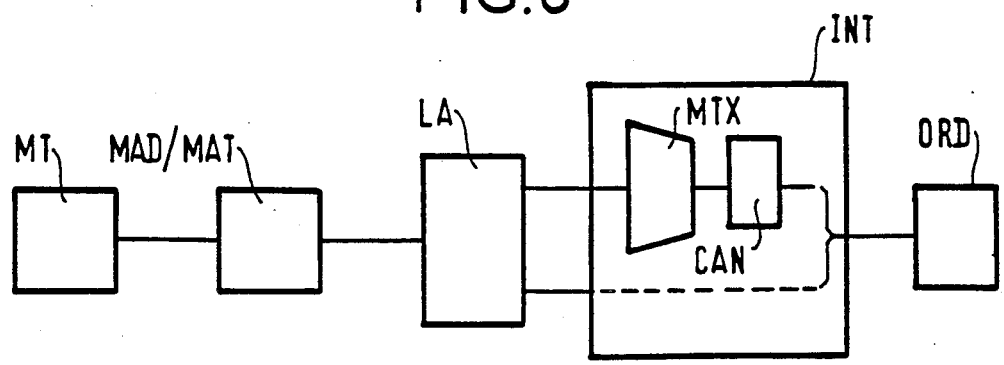
FIG. 6 is an overall diagram of a partial discharge measuring system in accordance with the present invention.

Finally, FIG. 6 is a diagram showing a computer ORD provided with an interface INT containing a multiplexer MTX, and an analog-to-digital converter CAN. The acquisition circuits MAD and MAT of FIGS. 3 and 4 and the acquisition command logic LA of FIG. 5 are connected to the interface INT. The interface INT converts the signals CR and AC of the logic circuit LA into interrupt requests in response to which the computer ORD addresses the circuits MAD/MAT via the multiplexer MTX and obtains digital values via the interposed converter CAN, which values correspond to the analog magnitude available on the outputs ST and STT. The signals CR and AC may also give rise to identical acquisition cycles in which, returning to the configuration shown in FIG. 2, eight paths treated by seven circuits MAD and one MAT circuit are all concerned by one recording cycle. If the recording cycle is caused by a partial discharge appearing, then the eight paths provide significant, i.e. non-zero, information. If the recording cycle is caused by establishing a maximum in the alternating power voltage, then the seven first paths provide zero values (since the signal AC is not present), and only the path corresponding to the circuit MAT provides a non-zero signal (constituted by the maximum observed positive or negative amplitude of the alternating voltage). Such records are therefore easily recognized for the purpose of counting half-periods of the alternating voltage and thus of locating in time the records relating to partial discharges.

Naturally the above descriptions are given purely by way of non-limiting example and numerous variants may be envisaged without thereby going beyond the scope of the present invention.

We claim:

1. A measurement system for making measurements relating to partial discharges, comprising a plurality of acquisition circuits, each including a signal input and a signal shaping circuit for providing a signal value, a multiplexer serving to deliver signal values provided by said various acquisition circuits, in succession, on a common path leading to a signal treatment and storage system, wherein some of said acquisition circuits are partial discharge acquisition circuits, each of said partial discharge acquisition circuits being connected to one of a plurality of measurement points of an installation subject to measurement, each partial discharge acquisition circuit comprising a comparator for providing a partial discharge signal whenever a partial discharge affects their signal input, and wherein an acquisition triggering circuit is provided which responds to the existence of a partial discharge signal as provided by any one of said partial discharge acquistion circuits by delivering an acquisition command signal, said signal treatment and storage system responding to an acquisition command signal by performing one acquisition cycle during which it stores the signal values provided by said various partial discharge acquisition circuits via said multiplexer.

2. A measurement system according to claim 1, wherein one of said acquisition circuits is a voltage acquisition circuit and provides an instantaneous measurement of the alternating power supply voltage of said installation.

3. A measurement system according to claim 2, wherein said voltage acquisition circuit includes means for making its supply of a measurement of the alternating power supply voltage of said installation conditional on the presence of said acquisition command signal.

4. A measurement system according to claim 2, wherein said acquisition trigger circuit includes means for responding to the appearance of a maximum voltage value on the input of said voltage acquisition circuit by providing an additional command signal.

5. A measurement system according to claim 1, wherein said signal treatment and storage system is a suitably programmed computer.

6. A measurement system according to claim 5, wherein the values of the signals are converted into digital form between the multiplexer and said computer.

* * * * *